(12) United States Patent
Kim

(10) Patent No.: US 8,653,866 B2
(45) Date of Patent: Feb. 18, 2014

(54) SEMICONDUCTOR DEVICE AND OPERATING METHOD THEREOF

(75) Inventor: Kwan-Dong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 225 days.

(21) Appl. No.: 12/630,252

(22) Filed: Dec. 3, 2009

(65) Prior Publication Data
US 2011/0102031 A1 May 5, 2011

(30) Foreign Application Priority Data
Oct. 30, 2009 (KR) .................. 10-2009-0104669

(51) Int. Cl.
*H03L 7/06* (2006.01)
(52) U.S. Cl.
USPC .......................................... 327/156; 327/158
(58) Field of Classification Search
USPC .................. 327/156, 158; 331/16, 17, 1 A
See application file for complete search history.

(56) References Cited

U.S. PATENT DOCUMENTS 7,859,345 B2 * 12/2010 Kawamoto ................... 331/17

FOREIGN PATENT DOCUMENTS

| JP | 2007-166163 | 6/2007 |
|----|----|----|
| KR | 1020020061352 A | 7/2002 |
| KR | 1020040064036 | 7/2004 |
| KR | 100784907 | 12/2007 |
| KR | 1020080002589 | 1/2008 |

OTHER PUBLICATIONS

Notice of Preliminary Rejection issued from Korean Intellectual Property Office on Mar. 25, 2011.
Notice of Allowance issued by the Korean Intellectual Property Office on May 18, 2012.

* cited by examiner

*Primary Examiner* — Lincoln Donovan
*Assistant Examiner* — Diana J Cheng
(74) *Attorney, Agent, or Firm* — IP & T Group LLP

(57) ABSTRACT

A semiconductor device includes a control voltage generating block configured to generate a control voltage corresponding to a phase difference between a reference clock signal and an internal clock signal, a control voltage restoring block configured to store the control voltage as a restoring voltage when entering into a low power mode and to supply the restoring voltage to a control voltage node when exiting from the low power mode, and an internal clock signal generating block configured to generate the internal clock signal corresponding to a voltage level of the control voltage.

16 Claims, 6 Drawing Sheets

SEMICONDUCTOR DEVICE AND OPERATING METHOD THEREOF

CROSS-REFERENCE TO RELATED APPLICATIONS

The present application claims priority of Korean Patent Application No. 10-2009-0104669, filed on Oct. 30, 2009, which is incorporated herein by reference in its entirety.

BACKGROUND OF THE INVENTION

Exemplary embodiments of the present invention relate to a semiconductor design technology, and more particularly, to a semiconductor device for generating internal clock signals such as a DLL clock signal and a PLL clock signal to drive internal circuits.

In general, semiconductor devices including a double data rate synchronous dynamic random access memory (DDR SDRAM) device generate internal clock signals based on an external clock signal and use the internal clock signals as a reference to set various operational timing points therein. Therefore, the semiconductor device includes circuits to generate the internal clock signals, and the circuits include a phase locked loop (PLL), a delay locked loop (DLL) and so on.

FIG. 1 is a block diagram illustrating a conventional PLL.

Referring to FIG. 1, the PLL includes a phase/frequency detecting block 110, a charge pumping block 130, a loop filtering block 150, a voltage control oscillating block 170 and a resetting block 190.

The phase/frequency detecting block 110 detects phase/frequency of a feed-back PLL clock signal CLK_PLL based on a reference clock signal CLK_REF. The charge pumping block 130 controls a voltage level of a control voltage (V_CTR) node in response to an output signal of the phase/frequency detecting block 110. The loop filtering block 150 generates a control voltage V_CTR to the V_CTR node under the control of the charge pumping block 130. The voltage control oscillating block 170 generates the PLL clock signal CLK_PLL having a frequency corresponding to the control voltage V_CTR. The PLL clock signal CLK_PLL generated by the voltage control oscillating block 170 is fed back to the phase/frequency detecting block 110.

The PLL, having the above construction, performs a locking operation and generates the PLL clock signal CLK_PLL having a frequency the semiconductor device desires through the locking operation. When the locking operation is completed, the control voltage V_CTR is designed to have a voltage level for generating the PLL clock signal CLK_PLL having the desired frequency.

Meanwhile, the semiconductor device may have a standby mode as a low power mode to consume less power. The standby mode includes a self-refresh operation. When the semiconductor device enters into the standby mode, circuits consuming high power, such as the PLL, stop their operations. As a result, the power consumption of the semiconductor device is reduced. In performing a standby mode operation of the PLL, the phase/frequency detecting block 110, the charge pumping block 130 and the voltage control oscillating block 170 are controlled by a PLL enable signal EN_PLL. Therefore, when entering into the standby mode, each of the foregoing blocks is inactivated. In exiting out of the standby mode, each of the blocks is activated again.

The initial control voltage V_CTR is reset to a desired voltage level to allow the voltage control oscillating block 170 to perform its operation normally. According to an exemplary embodiment, the resetting block 190 performs a reset operation for the control voltage V_CTR and thus provides a supply voltage VDD to the V_CTR node in response to the PLL enable signal EN_PLL. The reset operation is performed in response to the PLL enable signal EN_PLL in case the PLL enters into the standby mode. At this time, the phase/frequency detecting block 110, the charge pumping block 130 and the voltage control oscillating block 170 are inactivated as described above.

However, the conventional PLL loses the locking information by the reset operation. In other words, the control voltage V_CTR has a voltage level for generating the PLL clock signal CLK_PLL having the desired frequency at the point of time when the locking operation is completed. That is, the voltage level of the control voltage V_CTR becomes the locking information when the locking operation is completed. However, since the V_CTR node is reset to the supply voltage VDD by the reset operation, the PLL loses the locked state. This means that the locking operation is restarted when exiting from the standby mode.

Time taken until the control voltage V_CTR has a desired voltage level through the locking operation, i.e., a locking completion time, may be a few micro-seconds, and the locking completion time is a factor when exiting from the standby mode as well as in an initial operation of the PLL. Nowadays, under circumstances that semiconductor devices are developed for a high-speed operation, the locking completion time is a concern in obtaining a high-speed operation of the semiconductor device.

SUMMARY OF THE INVENTION

An exemplary embodiment of the present invention is directed to a semiconductor device capable of storing an analog control voltage as it is when a clock locking is completed and performing a locking operation using the stored control voltage when exiting from a standby mode.

In accordance with an exemplary embodiment of the present invention, a semiconductor device includes a control voltage generating block configured to generate a control voltage corresponding to a phase difference between a reference clock signal and an internal clock signal, a control voltage restoring block configured to store the control voltage as a restoring voltage when entering into a low power mode and to supply the restoring voltage to a control voltage node when exiting from the low power mode, and an internal clock signal generating block configured to generate the internal clock signal corresponding to a voltage level of the control voltage.

In accordance with another embodiment of the present invention, an operating method of a semiconductor device includes performing a locking operation to generate a control voltage corresponding to an internal clock signal, storing the control voltage as a restoring voltage when entering into a low power mode, and restoring a control voltage node to a voltage level corresponding to the restoring voltage when exiting from the low power mode.

The semiconductor device in accordance with exemplary embodiments of the present invention can reduce a locking completion time by storing the control voltage of the analog type as it is at the moment of the locking completed and performing the locking operation using the stored control voltage when exiting the standby mode. Therefore, it is possible to minimize the power consumed in the locking operation through the reduction of the locking completion time.

DESCRIPTION OF SPECIFIC EMBODIMENTS

Figure 1:
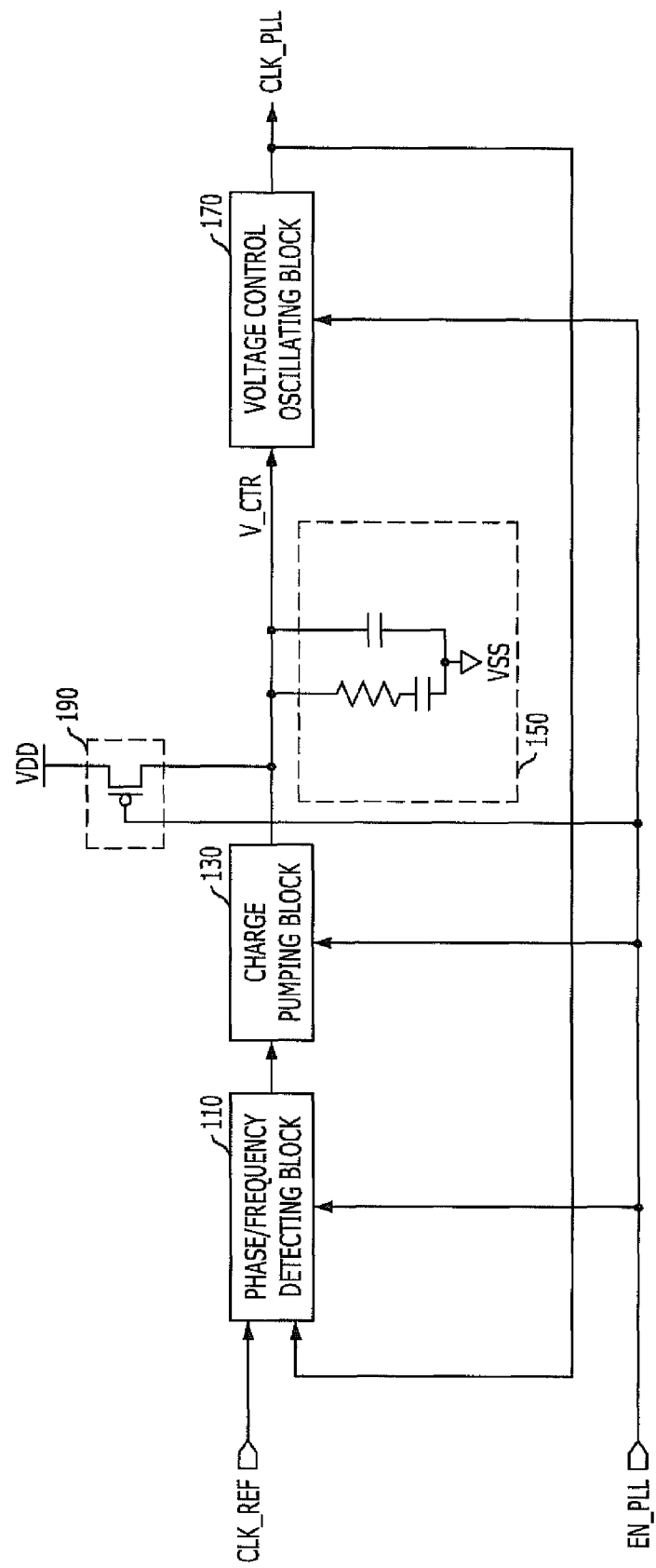
FIG. 1 is a block diagram illustrating a conventional phase locked loop.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
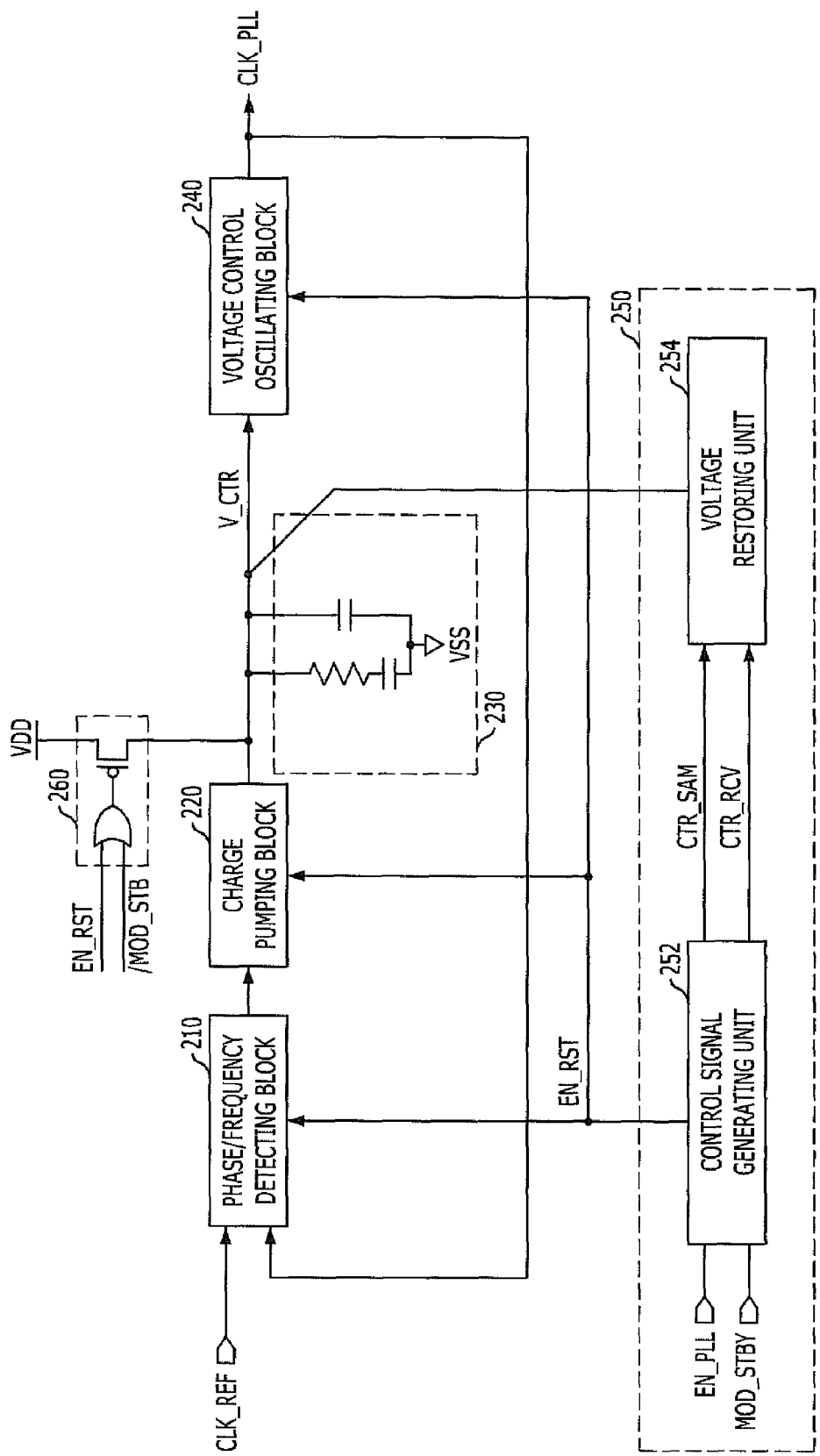
FIG. 2 is a block diagram illustrating a phase locked loop in accordance with an embodiment of the present invention.

FIG. 2 is a block diagram illustrating a phase locked loop (PLL) in accordance with an embodiment of the present invention.

Referring to FIG. 2, the PLL includes a phase/frequency detecting block 210, a charge pumping block 220, a loop filtering block 230, a voltage control oscillating block 240, a control voltage restoring block 250 and a resetting block 260.

The phase/frequency detecting block 210 detects phase/frequency of a feed-back PLL clock signal CLK_PLL based on a reference clock signal CLK_REF. The charge pumping block 220 controls a voltage level of a control voltage (V_CTR) node in response to an output signal of the phase/frequency detecting block 210. The loop filtering block 230 outputs a control voltage V_CTR to the V_CTR node under the control of the charge pumping block 220. The voltage control oscillating block 240 generates the PLL clock signal CLK_PLL having a frequency corresponding to the control voltage V_CTR. Herein, the control voltage V_CTR is an analog voltage having a voltage level for generating the PLL clock signal CLK_PLL with a desired frequency when the locking is completed.

For reference, the phase/frequency detecting block 210, the charge pumping block 220 and the loop filtering block 230 may be referred to as 'a control voltage generating circuit' for generating the control voltage V_CTR corresponding to the reference clock signal CLK_REF and the PLL clock signal CLK_PLL. The voltage control oscillating block 240 may be referred to as 'an internal clock signal generating circuit' for generating the PLL clock signal CLK_PLL, which is an internal clock signal corresponding to the control voltage V_CTR.

The control voltage restoring block 250 stores the control voltage V_CTR at a point of time where the locking is completed as a restoring voltage and provides the restoring voltage to the V_CTR node when exiting from the standby mode. Therefore, the control voltage restoring block 250 includes a control signal generating sector 252 and a voltage restoring sector 254. The restoring voltage in accordance with the embodiment of the present invention is an analog voltage stored in the control voltage restoring block 250.

Herein, the control signal generating sector 252 generates a sampling control signal CTR_SAM, which is enabled when entering into the standby mode, and a restoring control signal CTR_RCV, which is enabled when exiting from the standby mode. Thus, the control signal generating sector 252 generates the sampling control signal CTR_SAM and the restoring control signal CTR_RCV based on a PLL enable signal EN_PLL and a standby mode signal MOD_STBY inputted thereto.

The voltage restoring sector 254 stores a voltage level of the V_CTR node when entering into the standby mode and supplies the stored voltage level to the V_CTR node when exiting from the standby mode. Therefore, the voltage restoring sector 254 stores the voltage level of the V_CTR node as the restoring voltage in response to the sampling control signal CTR_SAM enabled when entering into the standby mode and supplies the restoring voltage to the V_CTR node in response to the restoring control signal CTR_RCV enabled when exiting the standby mode.

In the meantime, the resetting block 260 resets the V_CTR node after a certain period of time passes from the timing point of entering into the standby mode. That is, the resetting block 260 resets the V_CTR node with the supply voltage VDD in response to a reset enable signal EN_RST and a signal /MOD_STBY obtained by inverting the standby mode signal MOD_STBY. Operational timing diagrams of the signals will be described again with reference to FIG. 4.

Figure 3:
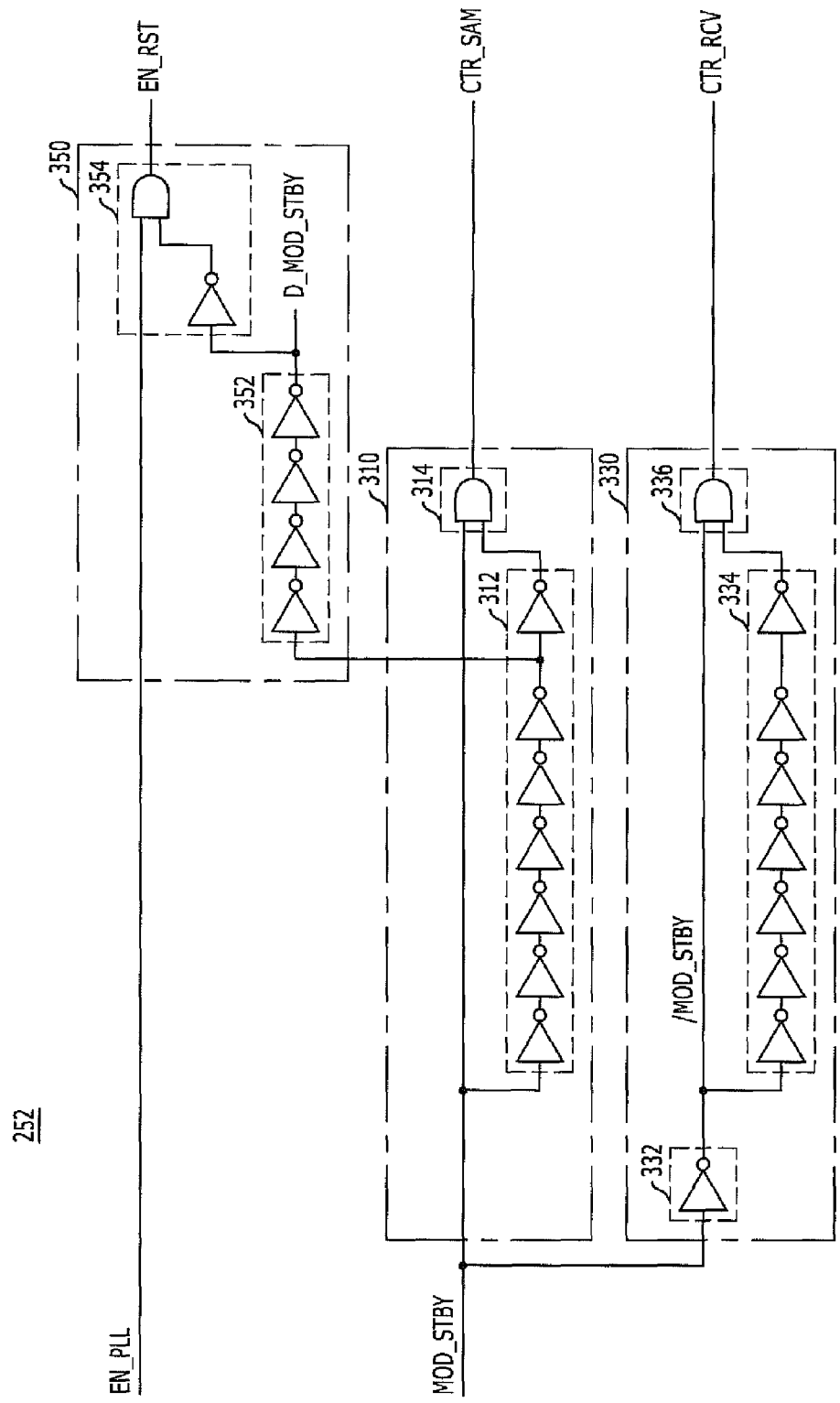
FIG. 3 illustrates a circuit diagram of a control signal generating sector described in FIG. 2.

FIG. 3 illustrates a circuit diagram of the control signal generating sector 252 described in FIG. 2.

Referring to FIG. 3, the control signal generating sector 252 includes first to third control signal generating units 310, 330 and 350.

The first control signal generating unit 310 generates the sampling control signal CTR_SAM having a predetermined pulse width based on the timing point of entry into the standby mode. For that purpose, the first control signal generating unit 310 includes a first delaying part 312 for receiving the standby mode signal MOD_STBY and delaying the received signal by a predetermined time, and a first outputting part 314 for outputting the sampling control signal CTR_SAM in response to the standby mode signal MOD_STBY and an output signal of the first delaying part 312.

The second control signal generating unit 330 generates the restoring control signal CTR_RCV having a preset pulse width based on the timing point of exiting the standby mode. For that purpose, the second control signal generating unit 330 includes an inverting part 332 for inverting the standby mode signal MOD_STBY inputted thereto, a second delaying part 334 for delaying the inverted standby mode signal /MOD_STBY outputted from the inverting part 332 by a preset time, and a second outputting part 336 for outputting the restoring control signal CTR_RCV in response to an output signal of the second delaying part 334 and the inverted standby mode signal /MOD_STBY. Hereinafter, for the simplicity of explanation, the standby mode signal MOD_STBY is referred to as a positive standby mode signal MOD_STBY and the output signal of the inverting part 332 that is obtained by inverting the standby mode signal MOD_STBY is referred to as a negative standby mode signal /MOD_STBY.

The third control signal generating unit 350 generates the reset enable signal EN_RST for controlling an active operation and a reset operation of the PLL. Herein, the third control signal generating unit 350 includes a third delaying part 352 for delaying a delayed signal of the positive standby mode signal MOD_STBY by a preset time to output a delayed standby mode signal D_MOD_STBY, and a third outputting part 354 for outputting the reset enable signal EN_RST in response to the PLL enable signal EN_PLL and the delayed standby mode signal D_MOD_STBY outputted from the third delaying part 352. Herein, the reset enable signal EN_RST is inputted to the resetting block 260 to control the reset operation for the V_CTR node, and provided to the phase/frequency detecting block 210, the charge pumping block 220 and the voltage control oscillating block 240 to control the activation and inactivation of the blocks 210, 220 and 240.

Figure 4:
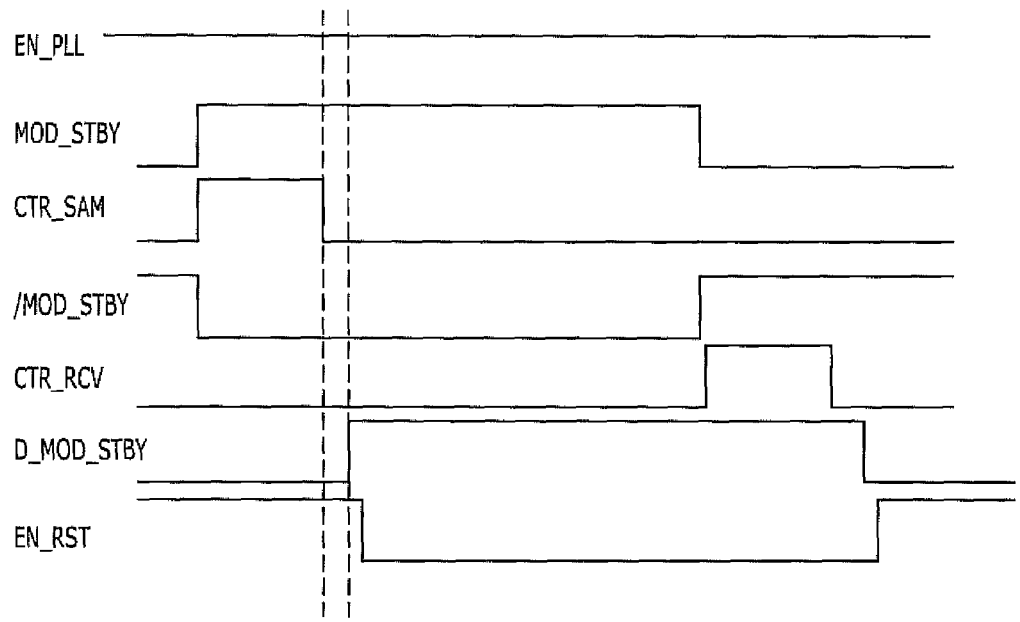
FIG. 4 illustrates a timing diagram of signals to explain an operation of the control signal generating sector described in FIG. 3.

FIG. 4 illustrates a timing diagram of signals to explain the operation of the control signal generating sector 252 described in FIG. 3.

As shown in FIG. 4, the PLL enable signal EN_PLL, the positive standby mode signal MOD_STBY, the sampling control signal CTR_SAM, the negative standby mode signal /MOD_STBY, the restoring control signal CTR_RCV, the delayed standby mode signal D_MOD_STBY, and the reset enable signal EN_RST are shown. The reset operation of the PLL in accordance with the embodiment of the present invention is activated in response to a new reset enable signal EN_RST. Herein, it is assumed that the PLL enable signal EN_PLL maintains a logic high level. Moreover, it is assumed that the locking operation is completed before the standby mode. That is, the control voltage V_CTR has a voltage level corresponding to the completion of the locking operation.

The operational waveforms of the signals when entering into and exiting from the standby mode will be described with reference to FIGS. 2 to 4.

First of all, when entering into the standby mode, the positive standby mode signal MOD_STBY transitions from a logic low level to a logic high level. Then, the first control signal generating unit 310 receives the positive standby mode signal MOD_STBY and generates the sampling control signal CTR_SAM having the predetermined pulse width. The pulse width of the sampling control signal CTR_SAM corresponds to a time taken to store the control voltage V_CTR when the locking operation is completed.

Subsequently, if the delayed standby mode signal D_MOD_STBY transitions from a logic low level to a logic high level, the reset enable signal EN_RST is enabled to a logic low level in response to the transition of the delayed standby mode signal D_MOD_STBY. The operations of the phase/frequency detecting block 210, the charge pumping block 220 and the voltage control oscillating block 240 are inactivated in response to the reset enable signal EN_RST, and the resetting block 260 performs the reset operation for the V_CTR node in response to the reset enable signal EN_RST. Herein, it is preferable that the reset enable signal EN_RST is enabled after the sampling control signal CTR_SAM is disabled. This is to stably store the locking information after the locking is completed.

Then, the second control signal generating unit 330 delays the negative standby mode signal /MOD_STBY by the preset time and generates the restoring control signal CTR_RCV having a pulse width corresponding to the delayed time. The pulse width of the restoring control signal CTR_RCV corresponds to a time taken to supply the restoring voltage to the V_CTR node.

Figure 5:
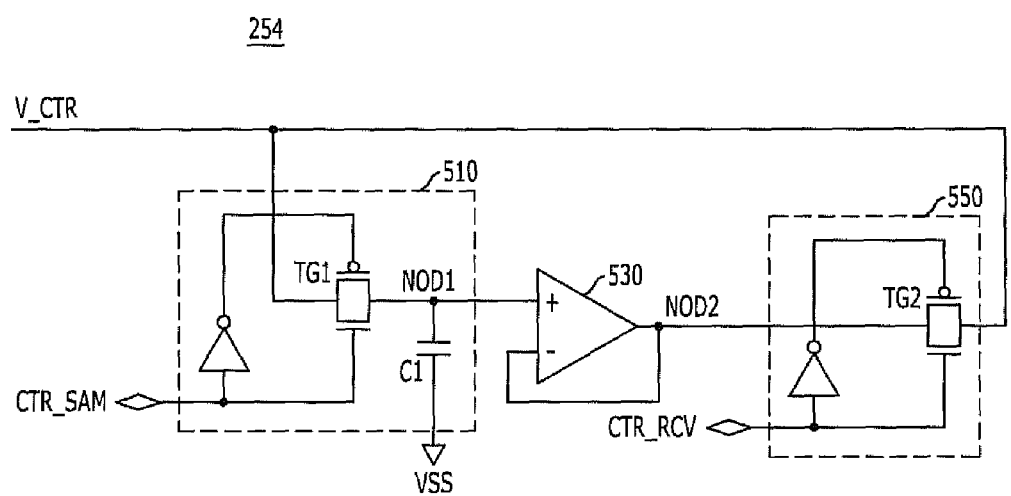
FIG. 5 illustrates a circuit diagram of a voltage restoring sector described in FIG. 2.

FIG. 5 illustrates a circuit diagram of the voltage restoring sector 254 described in FIG. 2.

Referring to FIG. 5, the voltage restoring sector 254 includes a voltage storing unit 510, a voltage maintaining unit 530 and a voltage restoring unit 550.

The voltage storing unit 510 stores the voltage level of the V_CTR node in response to the sampling control signal CTR_SAM, and thus it may include a first transmission gate TG1 turned on in response to the sampling control signal CTR_SAM and a capacitor C1 for storing a voltage level transmitted through the first transmission gate TG1. Herein, the capacitor C1 may be coupled between a first node NOD1 and a ground voltage (VSS) terminal. The capacitor C1 generates a voltage at the first node NOD1, and the generated voltage is the restoring voltage.

The voltage maintaining unit 530 constantly maintains a second node NOD2 with a voltage level substantially the same as the voltage level of the first node NOD1, and thus may include a buffer capable of driving the second node NOD2 to substantially the same voltage level as the voltage of the first node NOD1.

The voltage restoring unit 550 supplies the voltage level of the second node NOD2 to the control voltage V_CTR in response to the restoring control signal CTR_RCV, and thus may include a second transmission gate TG2 turned on in response to the restoring control signal CTR_RCV.

Figure 6:
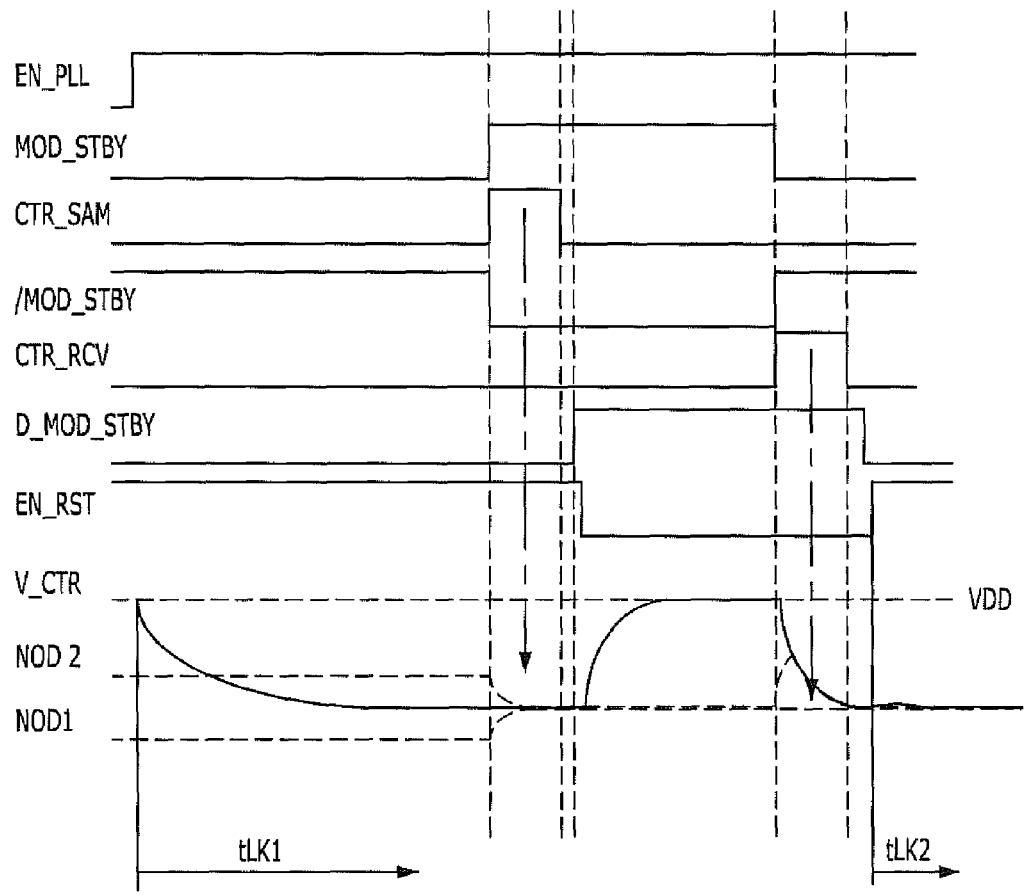
FIG. 6 is a timing diagram illustrating an operation of the voltage restoring sector described in FIG. 5, associated with a timing operation of each signal in FIG. 4.

FIG. 6 is a timing diagram illustrating an operation of the voltage restoring sector 254 described in FIG. 5, associated with a timing operation of each signal in FIG. 4.

Referring to FIGS. 5 and 6, in the locking operation, the PLL enable signal EN_PLL maintains a logic high level, and the positive standby mode signal MOD_STBY maintains a logic low level. During this period, the PLL performs the locking operation, and the voltage level of the V_CTR node is controlled to correspond to the phase/frequency of the PLL clock signal CLK_PLL and the reference clock signal CLK_REF (see FIG. 2) through the locking operation. As can be seen from the drawings, the locking completion time is 'tLK1'.

Then, when entering into the standby mode, i.e., if the positive standby mode signal MOD_STBY transitions to a logic high level, the capacitor C1 (see FIG. 5) is charged with the control voltage V_CTR during a period corresponding to the pulse width of the sampling control signal CTR_SAM. Thus, the first node NOD1 has a voltage level substantially the same as that of the control voltage V_CTR, and the operation of the voltage maintaining unit 530 allows the second node NOD2 to have a voltage level substantially the same as that of the control voltage V_CTR. That is, the first node NOD1 and the second node NOD2 maintain the analog restoring voltage corresponding to the voltage level of the control voltage V_CTR.

Subsequently, after the voltage level of the control voltage V_CTR is sufficiently stored, the sampling control signal CTR_SAM transitions to a logic low level, and the coupling between the V_CTR node and the first node NOD1 is cut off. Then, at a point of time where the reset enable signal EN_RST transitions to a logic low level, the reset operation of the resetting block 260 (see FIG. 2) makes the V_CTR node reset to the supply voltage VDD. However, the voltage levels of the first node NOD1 and the second node NOD2 maintain the stored restoring voltage regardless of the voltage level of the V_CTR node.

Meanwhile, when exiting the standby mode, i.e., if the positive standby mode signal MOD_STBY transitions to the logic low level, the voltage level of the second node NOD2 is supplied to the V_CTR node during a period corresponding to the pulse width of the restoring control signal CTR_RCV. Therefore, the V_CTR node reset to the supply voltage VDD is rapidly restored to the voltage level of the second node NOD2. As can be seen from the drawings, the locking completion time is 'tLK2'. The time corresponding to 'tLK2' is very shorter than the time corresponding to 'tLK1'. This means that the locking completion time of the PLL becomes shorter. Accordingly, in the embodiment of the present invention, since the locking is completed after the time corresponding to 'tLK2' passes, it is possible to generate the locked PLL clock signal CLK_PLL at that time.

Figure 7:
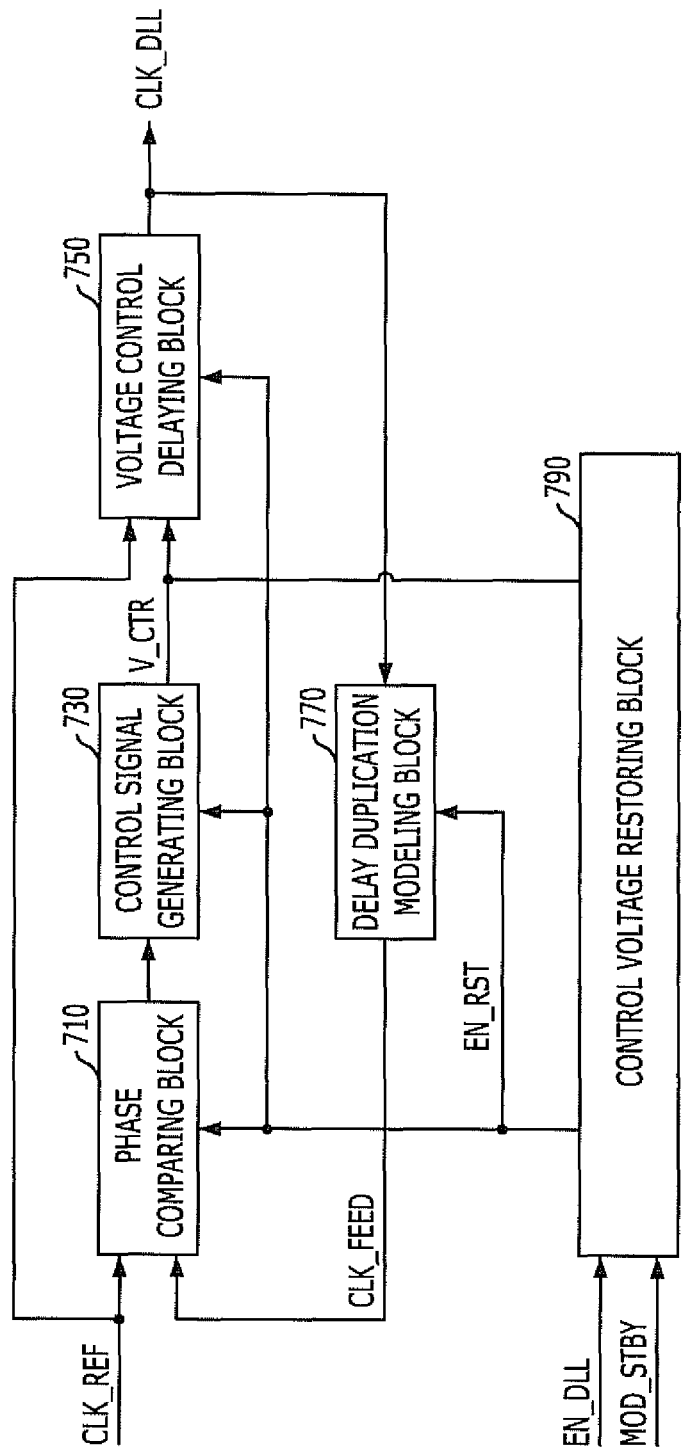
FIG. 7 illustrates a block diagram of a delay locked loop in accordance with another embodiment of the present invention.

FIG. 7 is a block diagram illustrating a delay locked loop (DLL) in accordance with another embodiment of the present invention.

Referring to FIG. 7, the DLL includes a phase comparing block 710, a control signal generating block 730, a voltage control delaying block 750, a delay duplication modeling block 770 and a control voltage restoring block 790. Herein, the detailed construction and operation of the control voltage restoring block 790 are omitted since the relevant explanation thereof has been described above with reference to FIGS. 2 to 6.

The phase comparing block 710 compares a phase of a reference clock signal CLK_REF with a phase of a feed-back clock signal CLK_FEED. Herein, the feed-back clock signal CLK_FEED is outputted from the delay duplication modeling block 770 and corresponds to a DLL clock signal CLK_DLL. The control signal generating block 730 generates an analog control voltage V_CTR in response to a signal outputted from the phase comparing block 710, and the voltage control delaying block 750 delays the reference clock signal CLK_REF by a delay time corresponding to the control voltage V_CTR and outputs the delayed reference clock signal CLK_REF as the DLL clock signal CLK_DLL. The delay duplication modeling block 770 generates the feedback clock signal CLK_FEED by reflecting a time obtained by modeling a delay path of clock/data on the DLL clock signal CLK_DLL.

For reference, the phase comparing block 710, the control signal generating block 730 and the delay duplication modeling block 770 may be referred to as 'a control voltage generating circuit' for generating the control voltage V_CTR corresponding to the reference clock signal CLK_REF and the DLL clock signal CLK_DLL, and the voltage control delaying block 750 may be referred to as 'an internal clock signal generating circuit' for generating the DLL clock signal CLK_DLL that is an internal clock signal corresponding to the control voltage V_CTR.

The DLL described in FIG. 7 in accordance with the embodiment of the present invention stores a voltage level of the control voltage V_CTR after the completion of the locking of the clock CLK_PLL for use as the restoring voltage when entering into the standby mode like the PLL of FIG. 2, and supplies the restoring voltage to the V_CTR node when exiting from the standby mode. As a result, it is possible to more rapidly perform the locking operation.

As described above, the PLL and the DLL in accordance with the embodiments of the present invention can reduce the locking completion time by storing the locking information such as an analog voltage after the locking completion before entering into the standby mode and rapidly restoring the V_CTR node to the voltage level at the moment of the locking completion by using the stored locking information when exiting from the standby mode. The reduction of the locking completion time means that it is possible to minimize the time required to perform the locking operation, which means that the power consumed in the locking operation is reduced.

In accordance with the embodiments of the present invention, it is possible to advance an operating point of the semiconductor device by reducing the locking completion time.

Moreover, it is possible to achieve a low power semiconductor device by minimizing the power consumed in the locking operation.

While the present invention has been described with respect to the specific embodiments, it will be apparent to those skilled in the art that various changes and modifications may be made without departing from the spirit and scope of the invention as defined in the following claims.

Furthermore, in the above embodiments, the illustrated logic gates and transistors may be implemented to have different locations and types according to polarities of signals inputted thereto.

What is claimed is:

1. A semiconductor device, comprising:
    a control voltage generating block configured to generate a control voltage, at a control voltage node, corresponding to a phase difference between a reference clock signal and an internal clock signal;
    a control voltage restoring block configured to store the control voltage as a restoring voltage when entering into a low power mode and to supply the restoring voltage to the control voltage node when exiting from the low power mode; and
    an internal clock signal generating block configured to generate the internal clock signal corresponding to a voltage level of the control voltage,
    wherein the control voltage restoring block comprises:
    a control signal generating sector configured to generate first and second control signals that are enabled based on timing points of entering into and exiting from the low power mode, respectively; and
    a voltage restoring sector configured to store the control voltage as the restoring voltage in response to the first control signal and to supply the restoring voltage directly to the control voltage node in response to the second control signal.

2. The semiconductor device of claim 1, wherein the control signal generating sector comprises:
    a first control signal generating unit configured to generate the first control signal having a predetermined pulse width based on the timing point of entering into the low power mode; and
    a second control signal generating unit configured to generate the second control signal having a preset pulse width based on the timing point of exiting from the low power mode.

3. The semiconductor device of claim 1, further comprising a resetting block configured to reset the control voltage node.

4. The semiconductor device of claim 3, wherein the control signal generating sector further comprises a third control signal generating unit configured to generate a third control signal to activate a reset operation of the resetting block after a predetermined time passes from the timing point of entering into the low power mode.

5. The semiconductor device of claim 4, wherein the control voltage generating block and the internal clock signal generating block are configured to be inactivated in response to the third control signal.

6. The semiconductor device of claim 4, wherein the third control signal is enabled after the first control signal is disabled.

7. The semiconductor device of claim 1, wherein the voltage restoring sector comprises:
    a voltage storing unit configured to store a voltage level of the control voltage node as the restoring voltage in response to the first control signal; and a voltage restoring unit configured to supply the restoring voltage to the control voltage node in response to the second control signal.

8. The semiconductor device of claim 7, wherein the voltage restoring sector further comprises a voltage maintaining unit coupled between the voltage storing unit and the voltage restoring unit and configured to constantly produce a voltage that tracks a voltage level of the restoring voltage.

9. The semiconductor device of claim 1, wherein the control voltage generating block comprises:
   a phase/frequency detecting sector configured to detect phase/frequency of the internal clock signal based on the reference clock signal;
   a charge pumping sector configured to control a voltage level of the control voltage node in response to an output signal of the phase/frequency detecting sector; and
   a loop filtering sector configured to output the control voltage to the control voltage node under the control of the charge pumping sector.

10. The semiconductor device of claim 1, wherein the control voltage generating block comprises:
   a delay duplication modeling sector configured to generate a feed-back clock signal by reflecting a delay time on the internal clock signal, wherein the delay time is obtained by modeling a delay path of clock/data;
   a phase comparing sector configured to compare a phase of the reference clock signal with a phase of the feed-back clock signal; and
   a control signal generating sector configured to generate the control voltage corresponding to an output signal of the phase comparing sector.

11. An operating method of a semiconductor device, the method comprising:
   performing a locking operation to generate, at a control voltage node, a control voltage corresponding to an internal clock signal;
   generating first and second control signals that are enabled based on timing points of entering into and exiting from the low power mode, respectively:
   storing the control voltage as a restoring voltage when entering into a low power mode in response to the first control signal; and
   restoring the control voltage node by directly supplying the stored restoring voltage to the control voltage node to have the restoring voltage when exiting from the low power mode in response to the second control signal.

12. The operating method of claim 11, wherein the first control signal has a predetermined pulse width in response to the timing point of entering into the low power mode, and the second control signal has a preset pulse width in response to the timing point of exiting from the low power mode.

13. The operating method of claim 11, wherein the storing of the control voltage as the restoring voltage is performed during a period corresponding to the pulse width of the first control signal, and the restoring of the control voltage node is performed during a period corresponding to the pulse width of the second control signal.

14. The operating method of claim 11, further comprising resetting the control voltage to a predetermined voltage.

15. The operating method of claim 14, wherein the resetting of the control voltage to the predetermined voltage is performed after the storing of the control voltage as the restoring voltage.

16. The operating method of claim 14, wherein the generating of the control voltage is inactivated during the resetting of the control voltage to the predetermined voltage.

* * * * *